(12) United States Patent
Taguchi et al.

(10) Patent No.: US 11,605,619 B2
(45) Date of Patent: Mar. 14, 2023

(54) SURFACE-EMITTING LIGHT SOURCE AND METHOD OF MANUFACTURING THE SAME

(71) Applicant: NICHIA CORPORATION, Anan (JP)

(72) Inventors: Koji Taguchi, Anan (JP); Yumiko Kameshima, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 203 days.

(21) Appl. No.: 17/186,918

(22) Filed: Feb. 26, 2021

(65) Prior Publication Data

US 2021/0272942 A1 Sep. 2, 2021

(30) Foreign Application Priority Data

Feb. 27, 2020 (JP) .............................. JP2020-032094

(51) Int. Cl.
| | | |
|---|---|---|
| H01L 25/13 | (2006.01) |
| H01L 33/50 | (2010.01) |
| H01L 33/60 | (2010.01) |
| H01L 33/62 | (2010.01) |
| H01L 33/58 | (2010.01) |

(52) U.S. Cl.
CPC ............. *H01L 25/13* (2013.01); *H01L 33/50* (2013.01); *H01L 33/58* (2013.01); *H01L 33/60* (2013.01); *H01L 33/62* (2013.01); *H01L 2933/0066* (2013.01)

(58) Field of Classification Search
CPC .......................... H01L 25/0753; H01L 33/486
See application file for complete search history.

(56) References Cited

U.S. PATENT DOCUMENTS

| | | | |
|---|---|---|---|
| 2005/0136249 A1 | 6/2005 | Arikawa et al. | |
| 2006/0290281 A1 | 12/2006 | Jean et al. | |
| 2010/0193830 A1* | 8/2010 | Lin | ........................ H01L 21/486 |
| | | | 257/E33.056 |
| 2012/0032197 A1 | 2/2012 | Kurimoto | |
| 2014/0353026 A1 | 12/2014 | Hattori | |
| 2018/0315896 A1 | 11/2018 | Nakabayashi et al. | |
| 2019/0067539 A1* | 2/2019 | Kwak | ..................... H01L 33/36 |
| 2021/0167046 A1* | 6/2021 | Minato | ............... H01L 25/0753 |

(Continued)

FOREIGN PATENT DOCUMENTS

| | | |
|---|---|---|
| JP | S63087859 U | 6/1988 |
| JP | H01197549 A | 8/1989 |
| JP | H06218985 A | 8/1994 |

(Continued)

*Primary Examiner* — Andrew J Coughlin
(74) *Attorney, Agent, or Firm* — Hunton Andrews Kurth LLP (57) ABSTRACT

A surface-emitting light source includes a plurality of light-emitting modules each including an array of a plurality of light sources and a wiring board disposed on an array of the plurality of light-emitting modules with an adhesive interposed therebetween. The plurality of light-emitting modules to be disposed on the wiring board are arranged such that a space is left between adjacent ones of the light-emitting modules. The adhesive contains a thermosetting resin and includes a penetrating portion inside the space. The penetrating portion includes a gap detached from a lateral surface of the light-emitting modules.

20 Claims, 11 Drawing Sheets

(56) References Cited

U.S. PATENT DOCUMENTS

| | | | | |
|---|---|---|---|---|
| 2021/0408347 A1* | 12/2021 | Tamura | .................. | H01L 33/58 |
| 2022/0099883 A1* | 3/2022 | Taguchi | ............... | G02B 6/0031 |

FOREIGN PATENT DOCUMENTS

| | | | |
|---|---|---|---|
| JP | 2001231734 | A | 8/2001 |
| JP | 2004119807 | A | 4/2004 |
| JP | 2005180257 | A | 7/2005 |
| JP | 2005248189 | A | 9/2005 |
| JP | 2007012615 | A | 1/2007 |
| JP | 2010010414 | A | 1/2010 |
| JP | 2010154245 | A | 7/2010 |
| JP | 2012054533 | A | 3/2012 |
| JP | 2015179802 | A | 10/2015 |
| JP | 2017208383 | A | 11/2017 |
| JP | 2018190770 | A | 11/2018 |
| JP | 2019204905 | A | 11/2019 |

* cited by examiner

SURFACE-EMITTING LIGHT SOURCE AND METHOD OF MANUFACTURING THE SAME

CROSS-REFERENCE TO RELATED APPLICATIONS

The present application claims priority under 35 U.S.C. § 119 to Japanese Patent Application No. 2020-032094, filed Feb. 27, 2020, the contents of which are hereby incorporated by reference in their entirety.

BACKGROUND

1. Technical Field

The present disclosure relates to a surface-emitting light source and a method of manufacturing the same.

2. Description of Related Art

A conventional surface-emitting light source includes a wiring board and a plurality of light-emitting modules mounted on the wiring board. For example, Japanese Unexamined Patent Application Publication No. 2001-231734, Japanese Unexamined Patent Application Publication No. 2010-010414, Japanese Unexamined Patent Application Publication No. 2010-154245, and Japanese Unexamined Patent Application Publication No. 2017-208383 each disclose a surface-emitting light source in which adjacent light-emitting modules are bonded to each other with an adhesive.

SUMMARY

An object of certain embodiments in the present disclosure is to provide a surface-emitting light source having good drop impact resistance and a method of manufacturing the same.

According to one aspect of the present invention, a surface-emitting light source includes a plurality of light-emitting modules each including an array of a plurality of light sources and a wiring board disposed on an array of the plurality of light-emitting modules with an adhesive interposed therebetween. The plurality of light-emitting modules to be disposed on the wiring board are arranged such that a space is left between adjacent ones of the light-emitting modules. The adhesive contains a thermosetting resin and includes a penetrating portion inside the space. The penetrating portion includes a gap detached from a lateral surface of the light-emitting modules.

According to another aspect of the present invention, a method of manufacturing a surface-emitting light source of an embodiment of the present disclosure includes providing a plurality of light-emitting modules each including an array of a plurality of light sources and a wiring board disposed on an array of the plurality of light-emitting modules arranged such that a space is left between adjacent ones of the light-emitting modules with an adhesive containing a thermosetting resin interposed therebetween, applying heat and pressure to the adhesive to bond the wiring board to the plurality of light-emitting modules by melting and curing the adhesive and to form a penetrating portion by curing the adhesive having molten and entered the space, and detaching the penetrating portion from a lateral surface of the light-emitting modules by applying pressure to the space to form a gap.

A surface-emitting light source and a method of manufacturing the same according to certain embodiments of the present disclosure can provide good drop impact resistance.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENT

The drawings referred to in the descriptions of certain embodiments below schematically illustrate the present invention. The scales, the distances, the positional relationship, and the like of members can be exaggerated, or illustration of a part of a member can be omitted. Also, the scale of a member and the distance between members can be inconsistent. Further, in the descriptions below, the same term or reference numeral generally represents the same member or a substantially equivalent member, and its detailed description will be omitted as appropriate. Directions such as "up/upper", "down/lower", "left", and "right" in the constitution of a wiring board are interchangeable according to the situation. Directions such as "up/upper" and "down/lower" in the present specification are not intended to represent absolute positions unless otherwise noted but represent relative positions between components in drawings referred to for the purpose of illustration.

Surface-Emitting Light Source

A surface-emitting light source 100 according to an embodiment of the present disclosure will be described referring to FIG. 1 to FIG. 4.

Figure 1:
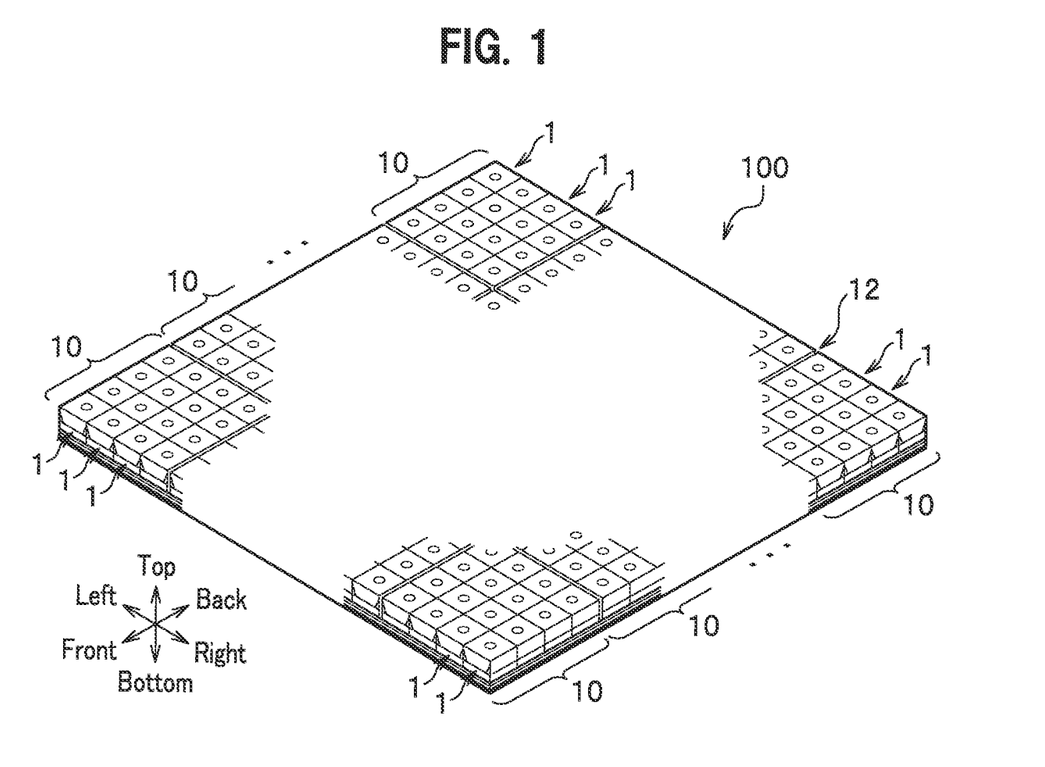
FIG. 1 is a schematic overall perspective view of a surface-emitting light source according to an embodiment of the present disclosure when viewed from the front side with the surface-emitting light source being partially omitted.
Figure 2:
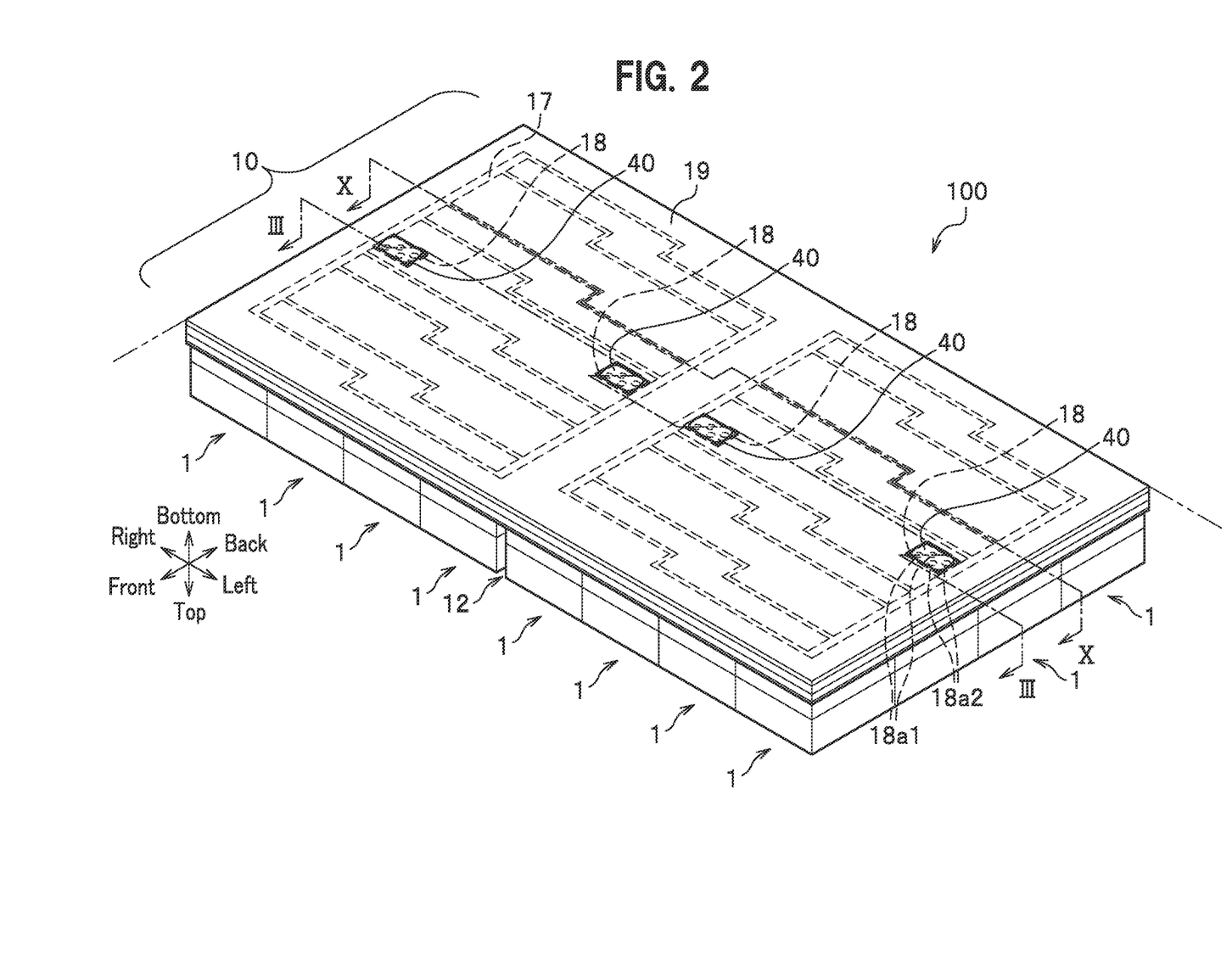
FIG. 2 is a schematic enlarged perspective view of a portion of the surface-emitting light source according to the embodiment when viewed from the back side.
Figure 3:
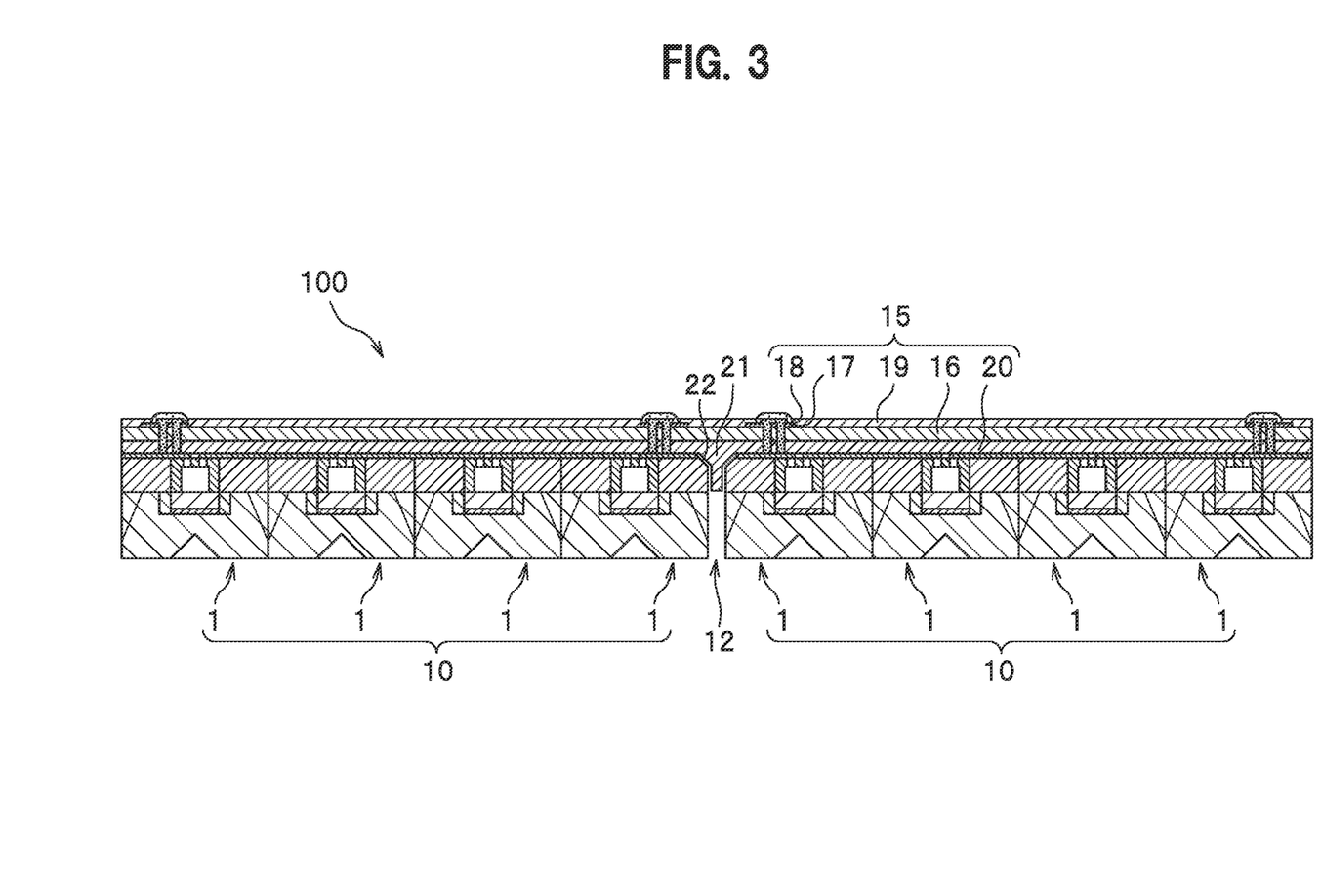
FIG. 3 is a schematic cross-sectional view taken along the line of FIG. 2.
Figure 4:
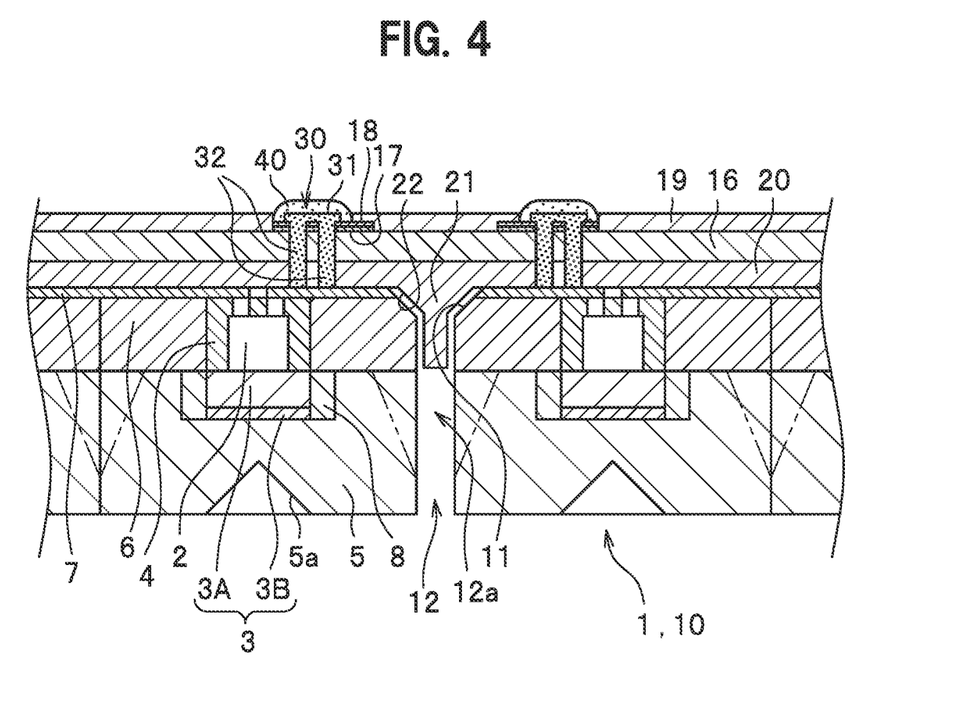
FIG. 4 is a schematic enlarged cross-sectional view of a portion of FIG. 3.

FIG. 1 is a schematic overall perspective view of the surface-emitting light source according to an embodiment of the present disclosure when viewed from the front side with the surface-emitting light source being partially omitted. FIG. 2 is a schematic enlarged perspective view of a portion of the surface-emitting light source according to the embodiment when viewed from the back side. FIG. 3 is a schematic cross-sectional view taken along the line of FIG. 2. FIG. 4 is a schematic enlarged cross-sectional view of a portion of FIG. 3.

The surface-emitting light source 100 includes a plurality of light-emitting modules 10 and a wiring board 15. Each of the light-emitting modules 10 includes an array of a plurality of light sources 1. The wiring board 15 is disposed on an array of the light-emitting modules 10 with an adhesive 20 interposed therebetween. The light-emitting modules 10 to be disposed on the wiring board 15 are arranged such that a space 12 is left between adjacent ones of the light-emitting modules 10. The adhesive 20 is made of a thermosetting resin and includes a penetrating portion 21 inside the space 12. The penetrating portion 21 includes a gap 22 detached from a lateral surface of the light-emitting modules 10. The structure of the surface-emitting light source 100 will be described below.

Wiring Board

The wiring board 15 allows the light-emitting modules 10 to form an array with the adhesive 20 interposed therebetween and supplies electric currents from an external device to the light-emitting modules 10. The wiring board 15 includes an insulating base member 16 and a first wiring layer 17 formed on the insulating base member 16. The wiring board 15 includes a pair of wiring pads 18 that are disposed for each light-emitting module 10 and are continuous with the first wiring layer 17 formed on the insulating base member 16. The pair of wiring pads 18 each have at least two (four in FIG. 2) via holes 18a1 and 18a2. The pair of wiring pads 18 are preferably disposed at one of opposite surfaces of the wiring board 15. In the present embodiment, the wiring board 15 is provided with a covering layer 19 at the one of the opposite surfaces at which the pair of wiring pads 18 are located, and the other surface of the opposite surfaces is bonded to the light-emitting modules 10 with the adhesive 20 interposed therebetween.

The insulating base member 16 constituting the wiring board 15 is made of, for example, an insulating resin material such as a phenolic resin, an epoxy resin, a polyimide resin, poly (ethylene terephthalate), poly (ethylene naphthalate), a silicone resin, a BT resin, or polyphthalamide. The insulating base member 16 may have a layered structure in which an insulating member is layered on a surface of a metal member. A rigid board or a flexible board can be used for the wiring board 15. A plurality of insulating base members 16 may be layered on each other to constitute the wiring board 15.

A metal material can be used for the first wiring layer 17 and the wiring pads 18. Suitable examples of the metal material include single-element metals such as Ag, Al, Ni, Rh, Au, Cu, Ti, Pt, Pd, Mo, Cr, and W and alloys containing these metals. Highly light-reflective single-element metals such as Ag, Al, Pt, and Rh and alloys containing these metals are more preferable.

The wiring pads 18 are, for example, rectangular regions wider than the width of wiring of the first wiring layer 17. The wiring pads 18 in the present embodiment are positioned at opposite to each other on the right and left sides of the first wiring layer 17 at both ends of the light-emitting module 10. The pair of wiring pads 18 each have two via holes 18a1 and two via holes 18a2. The via holes 18a1 and 18a2 are through holes passing through the insulating base member 16 and the adhesive 20 but become bottomed holes having bottoms by bonding of the light-emitting module 10 with a second wiring layer 7 of the light-emitting module 10 interposed therebetween.

The openings of the via holes 18a1 and 18a2 have shapes such as circles, ellipses, rectangles, *rhombi*, triangles, and crosses. The number of the via holes formed in each of the pair of wiring pads 18 is at least one, in the present embodiment, the number is four but not less than two.

The via holes 18a1 and 18a2 are preferably arranged in twos aligned side by side in an oblique direction relative to the direction of alignment of the light sources 1. Such an arrangement of the via holes 18a1 and 18a2 in the oblique direction allows an electrical conductor 30 to be easily supplied by screen printing to extend over the two via holes 18a1 and over the two 18a2.

The covering layer 19 having a predetermined thickness covers a predetermined region to protect the first wiring layer 17 and the like disposed on the wiring board 15. The covering layer 19 can be made of a polyimide resin, a phenyl silicone resin, a dimethyl silicone resin. The covering layer 19 preferably has openings to expose the wiring pads 18 or openings having areas smaller than the areas of the wiring pads 18 above the wiring pads 18. The electrical conductor 30 are supplied into the via holes 18a1 and 18a2 through the openings of the covering layer 19.

The adhesive 20 is made of a thermosetting resin such as a urethane resin and includes the penetrating portion 21 inside the space 12 between lateral surfaces of adjacent light-emitting modules 10. The penetrating portion 21 is formed by melting of the adhesive 20 made of a thermosetting resin and curing of the adhesive 20 that has molten and entered the space 12 in Pressing S12 in the manufacture of the surface-emitting light source 100 described below. The height of the penetrating portion 21 in the space 12 is not limited to particular values, but the penetrating portion 21 is preferably located closer to the wiring board 15 than the intermediate position in the height direction of the space 12 in a cross-sectional view. When an impact is given to the surface-emitting light source 100 from the outside, a region 12a of the space 12 in which the penetrating portion 21 is not formed reduces strain or deformation due to the impact.

The penetrating portion 21 includes the gap 22 detached from lateral surfaces of the light-emitting modules 10. The gap 22 may be in contact with or away from the lateral surfaces of the light-emitting modules 10. The gap 22 is formed by application of pressure to the space 12 in Detaching S13 in the manufacture of the surface-emitting light source 100 described below. The gap 22 is preferably formed on at least one of the lateral surfaces of the penetrating portion 21 facing the lateral surfaces of adjacent light-emitting modules 10, more preferably on both lateral surfaces of the penetrating portion 21. The gap 22 may be formed on a portion of a lateral surface of the penetrating portion 21 facing a lateral surface of the light-emitting module 10. When an impact is given to the surface-emitting light source 100 from the outside, the gap 22 and the space 12 reduce strain or deformation due to the impact. The term "gap 22" as used herein refers to a state in which equal to or more than half of the penetrating portion 21 entering the space 12 from the adhesive 20 is detached at either of the positions facing the lateral surfaces of the light-emitting modules 10.

The adhesive 20 preferably has a melt viscosity at 60° C. of $5.0\times10^4$ to $7.0\times10^5$ P. If the melt viscosity is $7.0\times10^5$ P or less, the adhesive 20 is likely to flow in the molten state in Pressing S12 into the space 12 to form the penetrating portion 21. If the melt viscosity is $5.0\times10^4$ or more, the penetrating portion 21 can be located closer to the wiring board 15 than the intermediate position in the height direction of the space 12 in a cross-sectional view, and the region 12a that reduces strain or deformation is likely to be secured in the space 12. The melt viscosity may be measured at 120° C., and the melt viscosity in this case is, for example, $4.0\times10^4$ to $2.0\times10^5$ P.

The wiring board 15 preferably includes the electrical conductor 30 supplied to extend across two via holes 18a1 and to be filled in the two via holes 18a1, and the protective members 40 covering the electrical conductor 30 from the one of the surfaces of the wiring board 15.

The electrical conductor 30 is supplied so as to extend over the two via holes 18a1 and the two via holes 18a2 to conduct electricity such that electric current from an external device is supplied to the array of the light sources 1. The electrical conductor 30 forms in-hole portions 32 positioned in the two via holes 18a1 and an intervening portion 31 extending over the in-hole portions 32 to lie on a portion of the surface of the wiring pad 18. Likewise, the electrical conductor 30 forms in-hole portions 32 positioned in the two via holes 18a2 and an intervening portion 31 extending over the in-hole portions 32 to lie on a portion of the surface of the wiring pad 18.

The electrical conductor 30 is made of, for example, a mixture of a filler such as flaky, scaly, or barky silver or copper powder and a thermosetting binder resin. A material with as small a volume resistivity as possible and small contents of the binder resin and a solvent component is preferably used for the electrical conductor 30.

The protective members 40 protect the wiring pads 18 and the electrical conductors 30. The protective members 40 may be made of a material similar to the material(s) for making the cover layer 19, such as a polyimide resin, a phenyl silicone resin, a dimethyl silicone resin, or the like. A pigment may be added to the protective members 40 to make the protective members 40 opaque.

Light-Emitting Module

In the surface-emitting light source 100, for example, a rectangular array (2 to 200 columns×2 to 200 rows) of light-emitting modules 10 is disposed on the wiring board 15 with the adhesive 20 interposed therebetween. The light-emitting modules 10 are disposed on the wiring board 15 such that the space 12 is left between adjacent light-emitting modules 10. For example, a rectangular array (2 to 200 columns×2 to 200 rows) of light sources 1 constitutes each light-emitting module 10.

Each light source 1 preferably includes, for example, a light-emitting element 2, a light-transmissive member 3 attached to the light extraction surface of the light-emitting element 2, a covering member 4 disposed on the lateral surfaces of the light-emitting element 2, a light-reflective member 6 disposed on the lateral surfaces of the covering member 4, and a light-guiding plate 5 that is disposed on the light-reflective member 6 and the light-transmissive member 3 and has an optical functional portion 5a.

For example, a known semiconductor light-emitting element can be used for the light-emitting element 2, and a light-emitting diode is an example of the light-emitting element 2. For the light-emitting element 2, a light source that emits blue light can be used, or a plurality of light-emitting elements that emit different colors of light can be used to emit, for example, white light as a mixture of red, blue, and green light. An element that emits light with any appropriate wavelength can be selected for the light-emitting element 2, and the composition, emission color, size, and number of the light-emitting element can be appropriately selected according to the purpose. Examples of elements that emit blue and green light include a light-emitting element employing a nitride semiconductor ($In_xAl_yGa_{1-x-y}N$, where $0\leq X$, $0\leq Y$, and $X+Y\leq1$) or GaP. A light-emitting element including a semiconductor such as GaAlAs and AlInGaP can be used as an element that emits red light. Semiconductor light-emitting elements made of materials other than the above materials can be used, and the emission wavelengths can be selected by changing the materials for the semiconductor layers and their mixing ratios.

The light-transmissive member 3 preferably includes a first light-transmissive member 3A that adjusts the emission color of the light-emitting element 2 and a second light-transmissive member 3B that is layered on the first light-transmissive member 3A to diffuse light. The first light-transmissive member 3A contains a light-transmissive material and a phosphor. The light-transmissive material is preferably formed of a material having a refractive index higher than the material of the light-guiding plate 5. A material such as an epoxy resin, a silicone resin, a mixture of these resins, and glass can be used, and it is suitable to select a silicone resin in view of resistance to light and ease of formation.

The range of wavelengths that can be converted by the first light-transmissive member 3A varies according to the type of the phosphor. It is therefore necessary to select an appropriate phosphor to convert desired wavelengths. Examples of the phosphor include YAG phosphors, LAG phosphors, chlorosilicate phosphors, β-SiAlON phosphors, CASN phosphors, SCASN phosphors, and fluoride phosphors such as KSF phosphors. In particular, one first light-transmissive member 3A preferably contains a plurality of types of phosphors, more preferably contains a β-SiAlON phosphor that emits green light and a fluoride phosphor, such as a KSF phosphor, that emits red light. This allows for expanding the color reproduction range of the surface-emitting light source 100.

In addition, the first light-transmissive member 3A containing a phosphor that emits light having a specific color can emit light having a specific color. The first light-transmissive member 3A can be quantum dots. A phosphor can be disposed in appropriate portions inside the first light-transmissive member 3A. An effective manner can be selected from among substantially even distribution, uneven distribution, lamination of a plurality of layers each containing at least one phosphor different from each other, and the like.

White powder is dispersed in the light-transmissive material serving as the base material to constitute the second light-transmissive member 3B. Fine particles of an inorganic substance such as $SiO_2$ and $TiO_2$ are used as the white powder.

The covering member 4 protects the light-emitting element 2 and reflects light from the lateral surfaces of the light-emitting element 2 toward the light extraction surface. The covering member 4 is disposed around the light-emitting element 2 such that the light-emitting element 2 is embedded in the covering member 4 for protection.

The material of the covering member 4 is preferably a light-reflective material having a reflectance of 60% or more, preferably 90% or more, of light emitted from the light-emitting element 2. The covering member 4 allows light emitted from the light-emitting element 2 to efficiently enter the light-guiding plate 5. The covering member 4 serves as both of a member protecting the light-emitting element 2 and a reflective member disposed on the surface opposite to the light exiting surface of the light-guiding plate 5. This allows the surface-emitting light source 100 to have the reduced thickness.

The light-reflective material of the covering member 4 is preferably a resin material containing a white pigment or the like. In order to reduce the cost of the surface-emitting light source 100, a silicone resin containing titanium oxide, which is inexpensive, is preferably used for the covering member 4.

The light-reflective member 6 protects the light-guiding plate 5 and reflects light from the lateral surfaces of the light-emitting element 2 toward the light extraction surface. The light-reflective member 6 is disposed around the covering member 4 to protect the light-guiding plate 5. The light-reflective member 6 is preferably constituted of substantially the same light-reflective material as for the covering member 4. The covering member 4 and the light-reflective member 6 may be constituted of the same light-reflective substance without boundaries.

The light-guiding plate 5 is a light-transmissive member that receives light emitted from the light source (the light-emitting element 2, the light-transmissive member 3, and the covering member 4) and performs surface light emission. The light-guiding plate 5 may have a plurality of optical functional portions 5a in a first main surface serving as the light emission surface and a recess accommodating the light-transmissive member 3 in a second main surface opposite to the first main surface. The light-guiding plate 5 may have a through hole passing through the first main surface and the second main surface to accommodate the light-transmissive member 3 or the light-emitting element 2.

For the material of the light-guiding plate 5, a resin material such as thermoplastic resins including acrylic resins, polycarbonates, cyclic polyolefins, poly (ethylene terephthalate), and polyesters and thermosetting resins including epoxy resins and silicone resins or a light-transmissive material such as glass can be used. A thermoplastic resin material is particularly preferable because efficient manufacture by injection molding is possible, and a polycarbonate, which is highly transparent and inexpensive, is further preferable. As for the surface-emitting light source 100 in which the second wiring layer 7 is formed after the light-emitting element 2 is mounted on the light-guiding plate 5, a thermoplastic material with low heat resistance, such as a polycarbonate, can be used because a step involving a high temperature such as reflow soldering can be omitted. The light-guiding plate 5 can be formed by, for example, injection molding or transfer molding.

The optical functional portion 5a reflects light emitted from the light-emitting element 2 to allow the light to radially spread out to level out the emission intensity within the plane of the light-guiding plate 5. The optical functional portion 5a can be constituted by various ways such as providing a member, such as a lens, having a function of reflecting or diffusing light on the light-guiding plate 5. For example, an interface to a substance, such as air, with a refractive index different from the refractive index of the material of the light-guiding plate 5 can be provided. The optical functional portion 5a is an inverted circular conical depression, but its size and shape can be appropriately selected. Specifically, a depression having the shape of an inverted polygonal pyramid such as an inverted quadrangular pyramid and an inverted hexagonal pyramid is also possible. The optical functional portion 5a is a depression as described above and can reflect, in the lateral directions of the light-emitting element 2, in other words, radially from the optical functional portion 5a, light applied on the interface between a substance with a refractive index different from the refractive index of the light-guiding plate 5 and the inclined surface of the depression. For example, a light-reflective member or a light-shielding member may be disposed in the optical functional portion 5a. The optical functional portion 5a can have a constitution in which a depressed portion having an inclined surface that is straight or curved in a cross-sectional view is provided with, for example, a metal reflective film or a reflective material such as a white resin. The optical functional portion 5a is preferably formed such that the extension of the optical axis passing through the center (tip of the depressed portion) of the optical functional portion 5a substantially coincides with the extension of the optical axis of the light-emitting element 2.

In the light source 1, the light-emitting element 2 is bonded to the light-transmissive member 3 with a light-transmissive adhesive. The light-transmissive adhesive preferably forms fillets on the lateral surfaces of the light-emitting element 2. In the light source 1, the light-guiding plate 5 is bonded to the light-transmissive member 3 with a bonding member 8. In this case, it is preferable to dispose the light-transmissive member 3 bonded to the light-emitting element 2 in the recess that is formed in the surface of the light-guiding plate 5 and faces the light-emitting element 2 and to dispose the bonding member 8 between the wall surfaces of the recess and the lateral surfaces of the light-transmissive member 3. A known adhesive such as a silicone resin can be used for the light-transmissive adhesive and the bonding member 8.

In the light-emitting module 10, the second wiring layer 7 electrically connected to electrodes of a plurality of light-emitting elements 2 is disposed. In the light-emitting module 10, the second wiring layer 7 is formed on a surface of the covering member 4, a surface of the light-reflective member 6 and a surface of the light-emitting element 2, and is disposed proximate to an electrode. When the light-emitting module 10 is connected to the wiring board 15 with the adhesive 20 interposed therebetween, the second wiring layer 7 is connected to the electrical conductors 30 disposed inside the via holes 18a1 and 18a2, so that the light-emitting elements 2 of the light sources 1 can be electrically connected.

In the surface-emitting light source 100, a plurality of light-emitting modules 10 are disposed such that the space 12 is left between adjacent light-emitting modules 10. The space 12 preferably has a width of 10 μm to 150 μm, more preferably 20 μm to 100 μm. If the width is 10 μm or more, the adhesive 20 in the molten state is likely to enter the space 12 in Pressing S12 described below to form the penetrating portion 21.

At least one of the lateral surfaces of adjacent light-emitting modules 10 in the surface-emitting light source 100 preferably has a chamfered portion 11 in which the width of the space 12 increases toward the wiring board 15. The chamfered portion 11 allows the adhesive 20 in the molten state to easily enter the space 12 in Pressing S12 described below to form the penetrating portion 21. The chamfered portion 11 can be formed by singulating the light-emitting modules 10 through dicing to provide the light-emitting modules 10 each of which includes the array of light sources 1 in Providing S11 described below.

As described above, in the surface-emitting light source 100, the space 12 is left between adjacent light-emitting modules 10, the adhesive 20 includes the penetrating portion 21 inside the space 12, and the penetrating portion 21 includes the gap 22 detached from the lateral surfaces of the light-emitting modules 10. Hence, the impact caused by the contact between the adjacent light-emitting modules 10, when an impact is given from the outside, is reduced, and breakage and the like are therefore reduced. The penetrating portion 21 inside the space 12 and the gap 22 of the penetrating portion 21 have the function of absorbing impacts from the outside, so that strain or deformation due to the impact is reduced. Accordingly, the drop impact resistance of the surface-emitting light source 100 is improved. In addition, luminance non-uniformity and unevenness in emission color of the surface-emitting light source 100 caused by strain or deformation are reduced.

Method of Manufacturing Surface-emitting Light Source

Next, a method of manufacturing the surface-emitting light source 100 described above will be described referring to FIG. 5 to FIG. 11.

Figure 5:
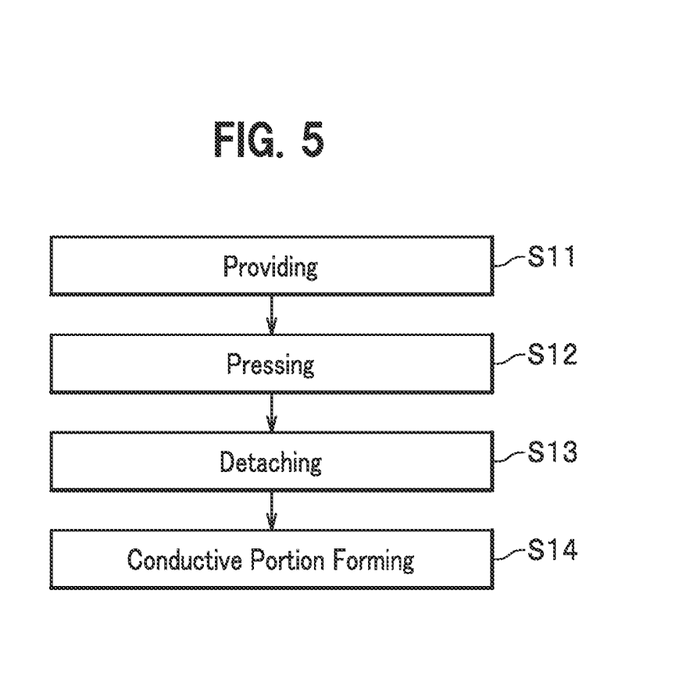
FIG. 5 is a flowchart of a method of manufacturing the surface-emitting light source according to the embodiment.
Figure 6:
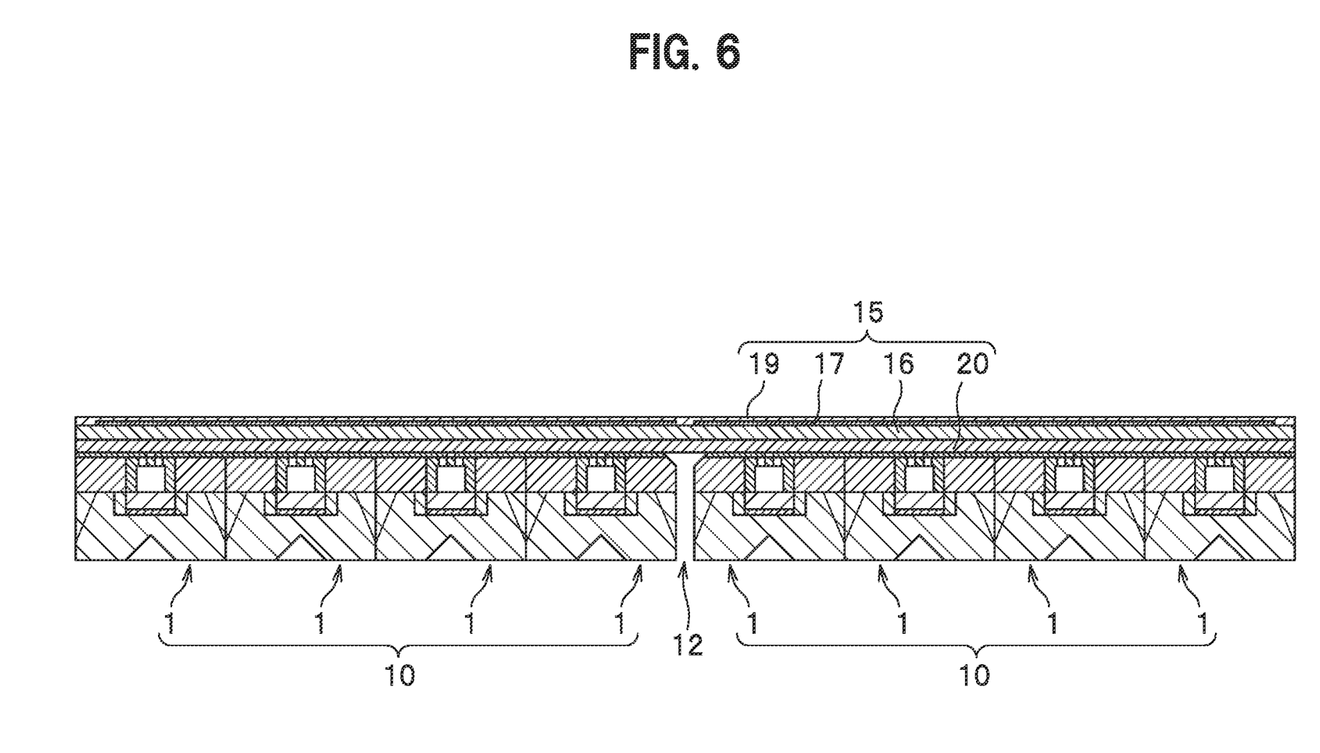
FIG. 6 is a schematic cross-sectional view of a wiring board and a plurality of light-emitting modules provided in a method of manufacturing the surface-emitting light source according to the embodiment taken along the line X-X of FIG. 2.
Figure 7:
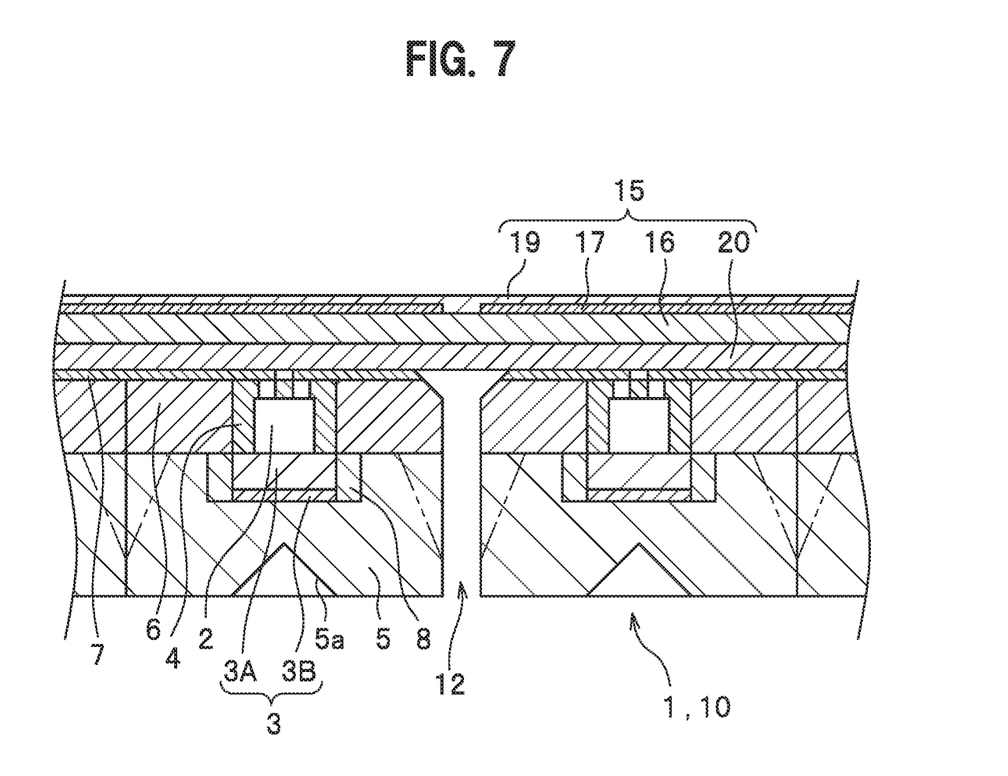
FIG. 7 is a schematic enlarged cross-sectional view of a portion of FIG. 6.
Figure 8:
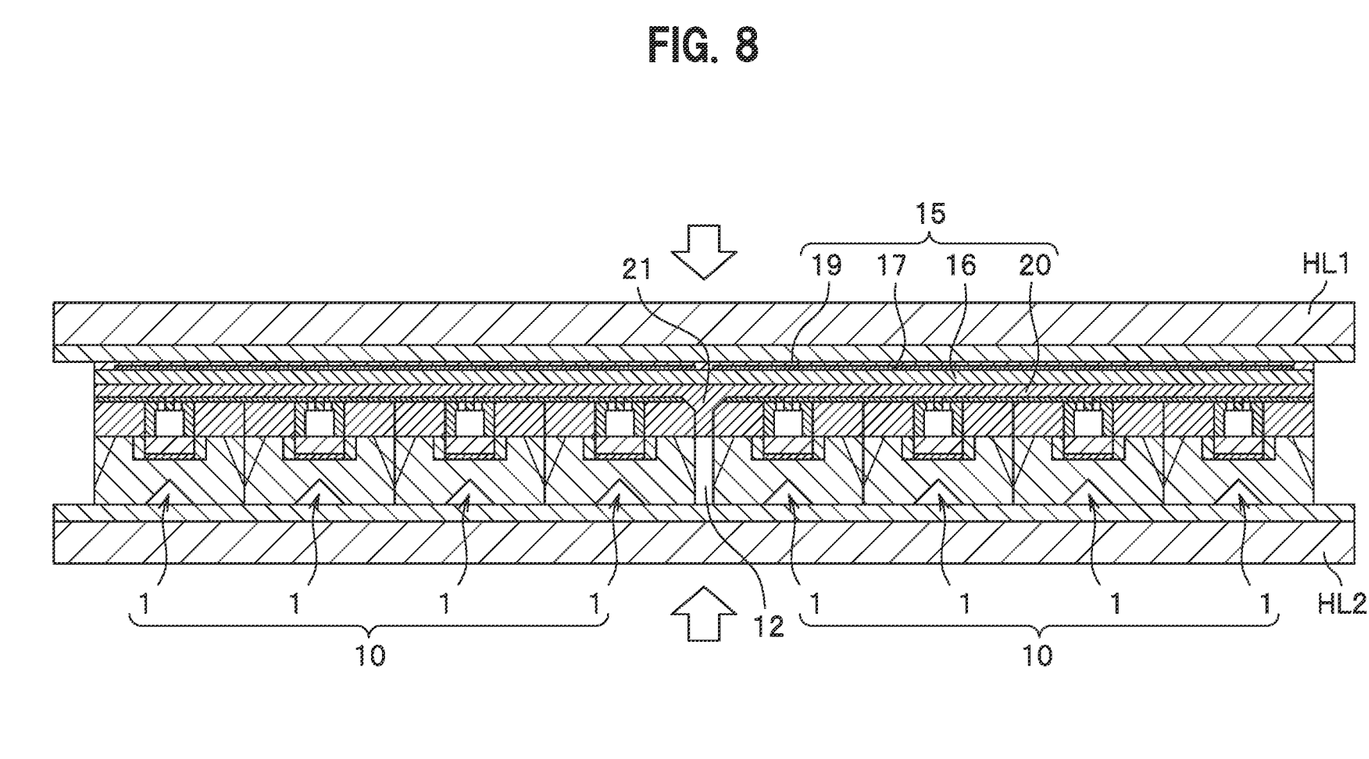
FIG. 8 is a schematic cross-sectional view of pressing of an adhesive using heating plates in applying hot pressure in the method of manufacturing the surface-emitting light source according to the embodiment taken along the line X-X of FIG. 2.
Figure 9:
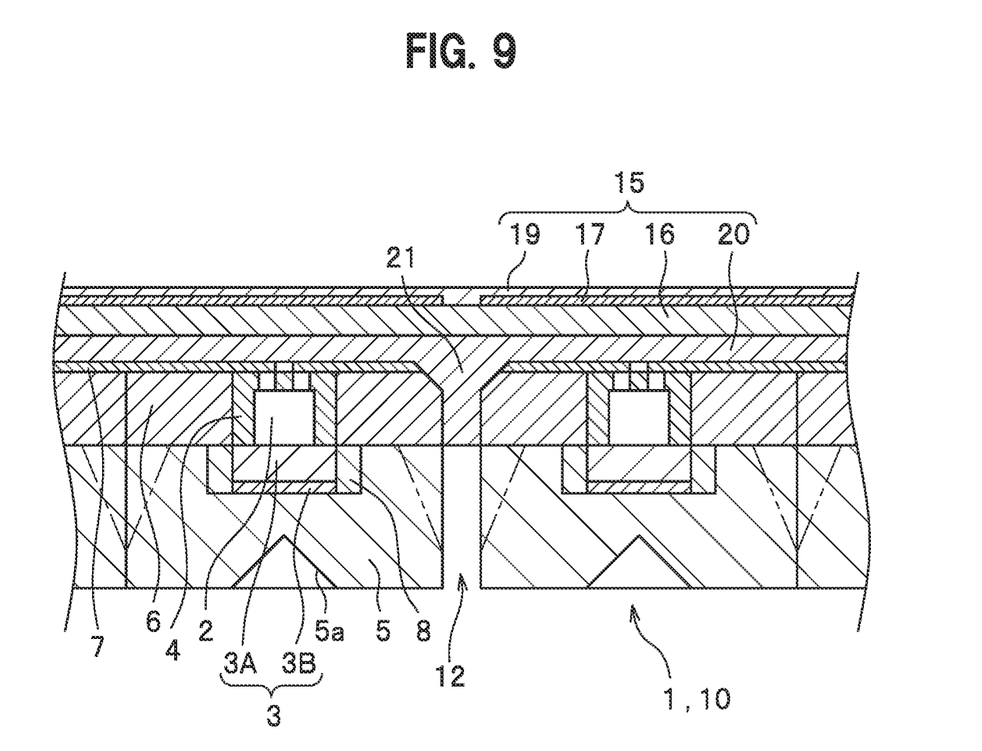
FIG. 9 is a schematic enlarged cross-sectional view of a portion of FIG. 8.
Figure 10:
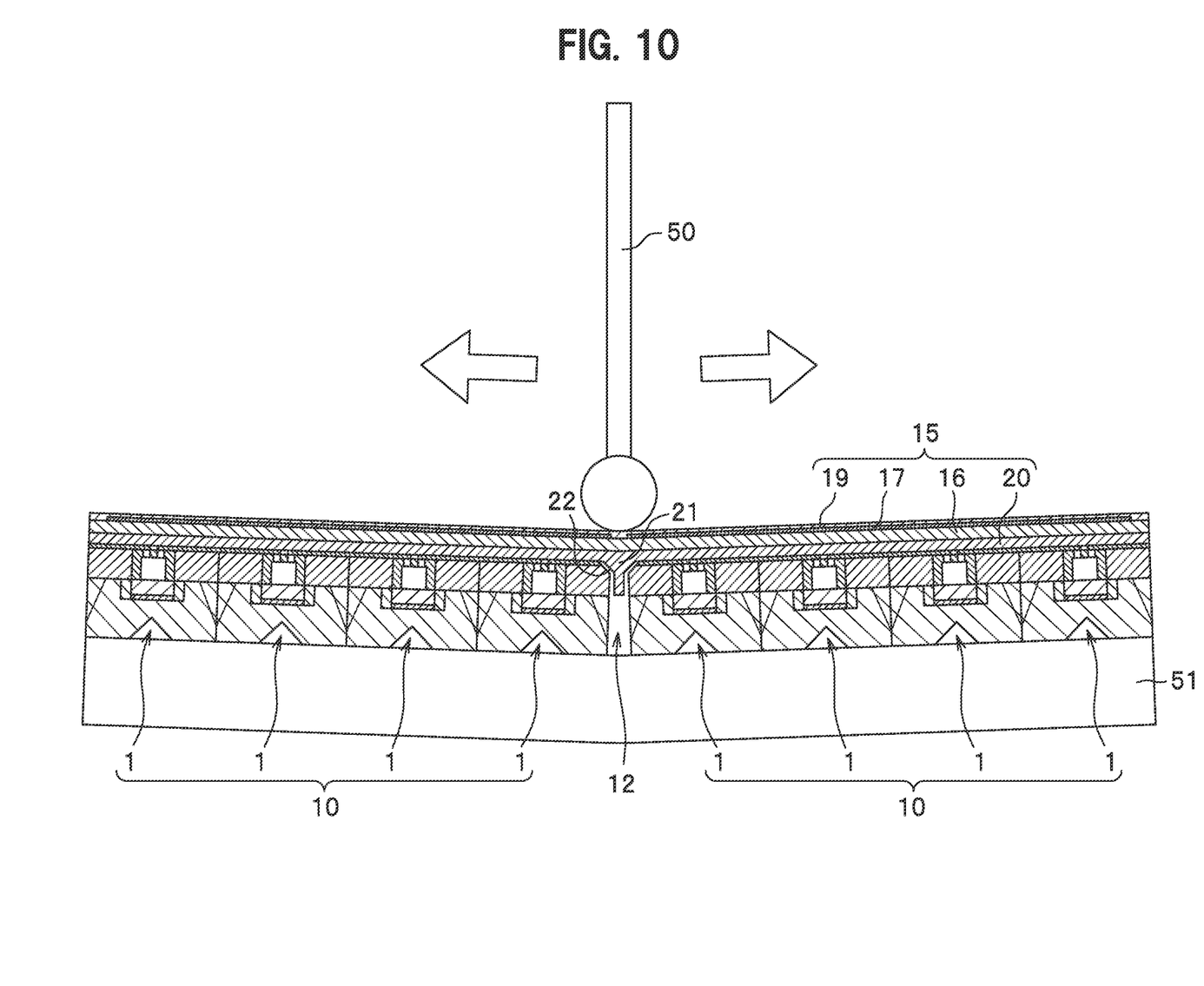
FIG. 10 is a schematic cross-sectional view of pressing of a space using a roller in detaching in the method of manufacturing the surface-emitting light source according to the embodiment taken along the line X-X of FIG. 2.
Figure 11:
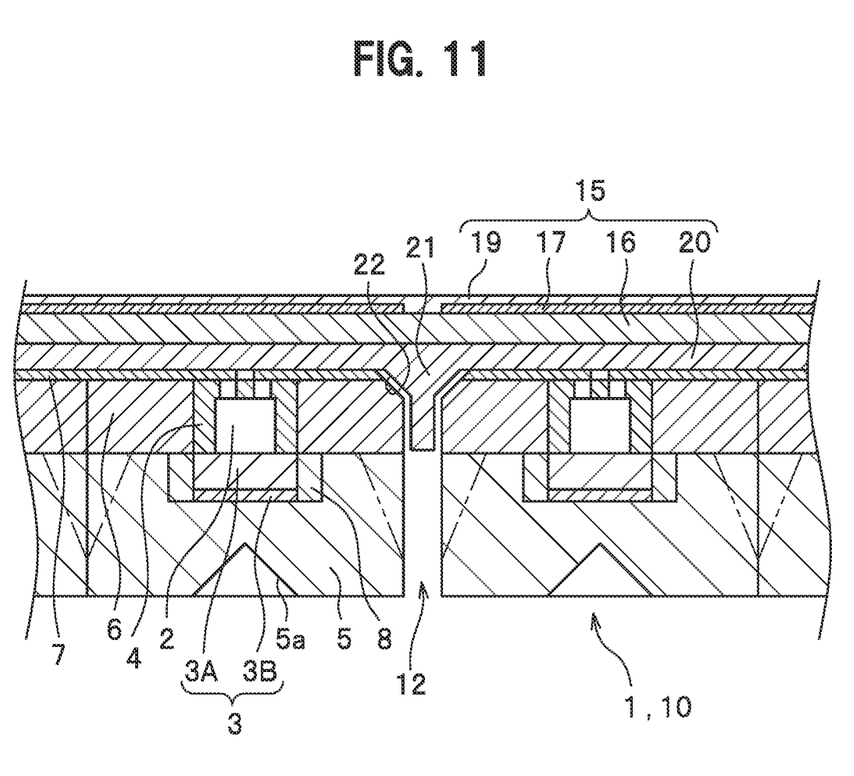
FIG. 11 is a schematic enlarged cross-sectional view of a portion of FIG. 10.

FIG. 5 is a flowchart of the method of manufacturing the surface-emitting light source according to the embodiment. FIG. 6 is a schematic cross-sectional view of the wiring board and the plurality of light-emitting modules provided in the providing of the method of manufacturing the surface-emitting light source according to the embodiment taken along the line X-X of FIG. 2. FIG. 7 is a schematic enlarged cross-sectional view of a portion of FIG. 6. FIG. 8 is a schematic cross-sectional view of pressing of the adhesive using heating plates in an applying hot pressure in the method of manufacturing the surface-emitting light source according to the embodiment taken along the line X-X of FIG. 2. FIG. 9 is a schematic enlarged cross-sectional view of a portion of FIG. 8. FIG. 10 is a schematic cross-sectional view of pressing of the space using a roller in the detaching in the method of manufacturing the surface-emitting light source according to the embodiment taken along the line X-X of FIG. 2. FIG. 11 is a schematic enlarged cross-sectional view of a portion of FIG. 10.

The method of manufacturing the surface-emitting light source includes Providing S11, Pressing S12, and Detaching S13. In Providing S11, a plurality of light-emitting modules 10 and a wiring board 15 are provided. The plurality of light-emitting modules 10 each includes an array of a plurality of light sources 1. The wiring board 15 is disposed on an array of the plurality of light-emitting modules 10 arranged such that the space 12 is left between adjacent ones of the light-emitting modules 10 with the adhesive 20 made of a thermosetting resin interposed therebetween. In Pressing S12, heat and pressure are applied to the adhesive 20 to bond the wiring board 15 to the plurality of light-emitting modules 10 by melting and curing the adhesive 20 and to form the penetrating portion 21 by curing the adhesive 20 having molten and entered the space 12. In Detaching S13, the penetrating portion 21 is detached from a lateral surface of the light-emitting modules 10 by applying pressure to the space 12 to form a gap 22. Each step is described in detail below.

Providing

In Providing S11, a plurality of light-emitting module 10 and the wiring board 15 bonded to the light-emitting modules 10 are provided. In Providing S11, the light-emitting modules 10 are formed by dicing of a segment array including an array of a large number of light sources 1 using a dicer or the like to provide the light-emitting modules 10 each including an array of a predetermined number of light sources 1. Each of the light-emitting modules 10 formed by dicing has the chamfered portion 11 on at least one of the lateral surfaces. The wiring board 15 includes the insulating base member 16, the first wiring layer 17 formed on the one of the surfaces of the insulating base member 16, and the covering layer 19 covering the first wiring layer 17. The adhesive 20 is disposed on the other surface of the insulating base member 16. In Providing S11, a plurality of light-emitting modules 10 are disposed with the space(s) 12 interposed therebetween, and the wiring board 15 is disposed on the light-emitting modules 10 such that the light-emitting modules 10 face the adhesive 20 of the wiring board 15.

In Providing S11, the light-guiding plates 5 are provided for the light sources 1. The light-guiding plates 5 have the optical functional portions 5a formed in advance and the recesses disposed at opposite to the optical functional portions 5a. The light sources including the light-emitting elements 2, the covering members 4, and the light-transmissive members 3 are provided. The light sources are disposed in the recesses of the light-guiding plates 5, the wall surfaces of the recesses are bonded to the lateral surfaces of the light-transmissive members 3 with the bonding members 8, the light-reflective members 6 are disposed to cover the light-guiding plates 5 and the bonding members 8, and the second wiring layer 7 is formed to connect the outer leads of the light-emitting elements 2.

Pressing

In Pressing S12, heat and pressure are applied to the adhesive 20 to bond the wiring board 15 to the light-emitting modules 10 and to form the penetrating portion 21 of the adhesive 20 inside the space 12. In Pressing S12, for example, heat and pressure are applied to the adhesive 20 using upper and lower heating plates HL1 and HL2 whose temperatures can be controlled. The pressure may be applied with a release film being disposed on each of the heating plates HL1 and HL2. In Pressing S12, the adhesive 20 constituted of a thermosetting resin is molten and cured by application of heat and pressure to the adhesive 20 to bond the wiring board 15 to the light-emitting modules 10. In Pressing S12, the molten adhesive 20 enters the space 12 and is cured to form the penetrating portion 21 bonded to part of the lateral surfaces of adjacent light-emitting modules 10.

In Pressing S12, the penetrating portion 21 is preferably formed such that the height of the penetrating portion 21 in a cross-sectional view is located closer to the wiring board 15 than the intermediate position in the height direction of the space 12. Such a penetrating portion 21 is provided by setting the temperatures of the heating plates HL1 and HL2 and the pressures to be applied to the heating plates HL1 and HL2 in consideration of the type and melt viscosity of the thermosetting resin constituting the adhesive 20.

Detaching

In Detaching S13, the gap 22 of the penetrating portion 21 in which the penetrating portion 21 is detached from the lateral surfaces of the light-emitting modules 10 is formed by applying pressure to the space 12. In Pressing S12 described above, the light-emitting modules 10 bonded to the wiring board 15 are bent toward the wiring board 15 in a cross-sectional view due to curing of the adhesive 20. In Detaching S13, the light-emitting modules 10 bonded to the wiring board 15 becomes flat toward the wiring board 15 in a cross-sectional view due to formation of the gap 22 of the penetrating portion 21 of the adhesive 20 inside the space 12.

Pressure is applied to the space 12 in Detaching S13 preferably such that the light-emitting modules 10 bonded to the wiring board 15 become flat. The pressing method is not limited as long as the light-emitting modules 10 bonded to the wiring board 15 become flat toward the wiring board 15 in a cross-sectional view. A preferable example of the pressing method of the space 12 is to press a jig 50 against the space from above the wiring board 15 bonded to the light-emitting modules 10. A more preferable example is to place the light-emitting modules 10 bonded to the wiring board 15 on a stage 51 and press the jig 50 against the space from above the wiring board. The stage 51 is preferably constituted of an elastic body such as a sponge that can prevent breakage and the like of the light-emitting modules 10 by buffering the force applied to the light-emitting modules 10. A metal roller with good workability is preferably used as the jig 50. In Detaching S13, the jig 50 is moved several times in the anterior-posterior direction with the position of the space 12 at the center along the longitudinal direction of the wiring board 15 while being pressed from above the wiring board.

The method of manufacturing the surface-emitting light source 100 may include Conductive Portion Forming S14 of forming a conductive portion to provide electrical continuity between a plurality of light-emitting modules 10 and the wiring board 15 after Detaching S13. In this case, the wiring board 15 bonded to the light-emitting modules 10 provided in Providing S11 is the wiring board 15 that has, on the one of the surfaces, the first wiring layer 17 and at least two of the via holes 18a1 and 18a2 formed for each pair of wiring pads 18 continuous with the first wiring layer 17 and that includes the electrical conductor 30 supplied to extend over the two via holes 18a1 and 18a2, and the protective member 40 covering the electrical conductor 30 from the one of the surfaces.

Conductive Portion Forming

Figure 12A:
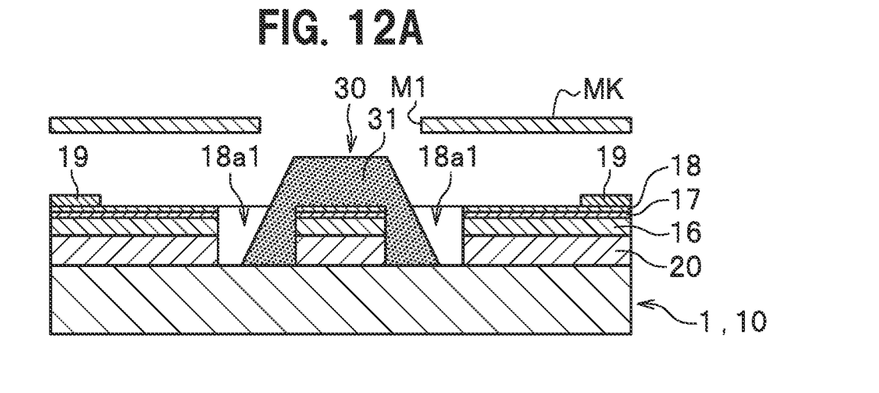
FIG. 12A is a schematic partial cross-sectional view illustrating an electrical conductor that has been supplied into via holes formed in a wiring pad in a conductive portion forming in the method of manufacturing the surface-emitting light source according to the embodiment taken along the line of FIG. 2.

Conductive Portion Forming S14 will be described referring to FIG. 12A to FIG. 12C. FIG. 12A is a schematic partial cross-sectional view illustrating the electrical conductor that has been supplied into the via holes formed in the wiring pad in the conductive portion forming in the method of manufacturing the surface-emitting light source according to the embodiment taken along the line of FIG. 2.

Figure 12B:
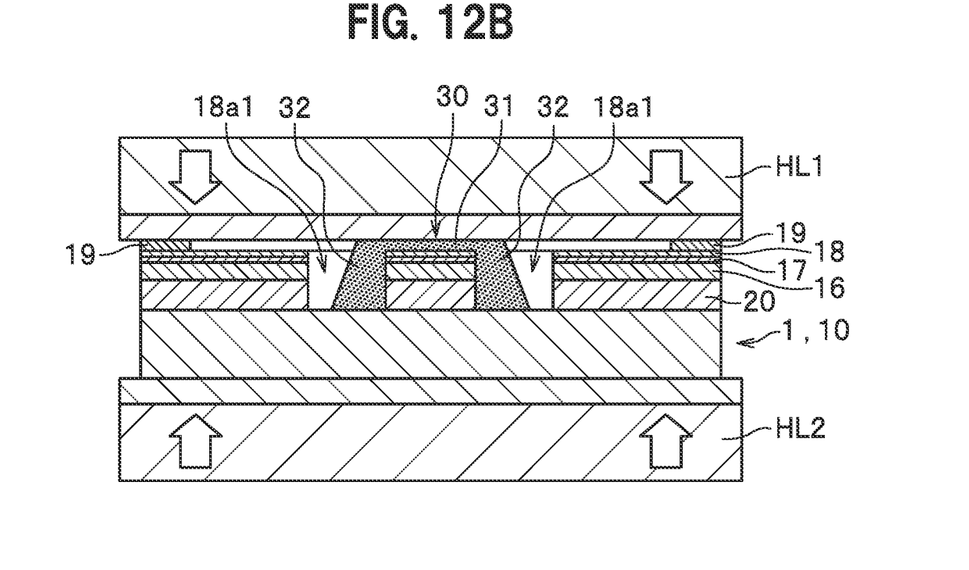
FIG. 12B is a schematic partial cross-sectional view of pressing of the electrical conductor using the heating plates in the conductive portion forming in the method of manufacturing the surface-emitting light source according to the embodiment taken along the line of FIG. 2.
Figure 12C:
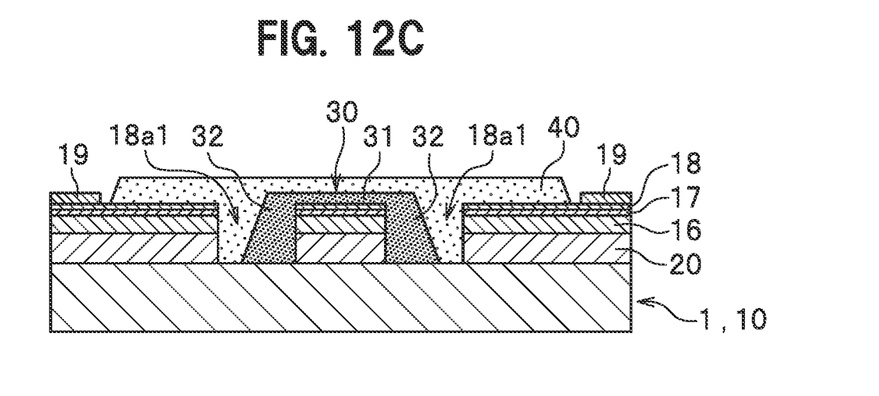
FIG. 12C is a schematic partial cross-sectional view of formation of a protective member over the cured electrical conductor in the conductive portion forming in the method of manufacturing the surface-emitting light source according to the embodiment taken along the line of FIG. 2.

FIG. 12B is a schematic partial cross-sectional view of pressing of the electrical conductor using the heating plates in the conductive portion forming in the method of manufacturing the surface-emitting light source according to the embodiment taken along the line of FIG. 2. FIG. 12C is a schematic partial cross-sectional view of formation of the protective member over the cured electrical conductor in the conductive portion forming in the method of manufacturing the surface-emitting light source according to the embodiment taken along the line of FIG. 2.

Conductive Portion Forming S14 includes a supplying in which the electrical conductor 30 is supplied into the via holes 18a1 and 18a2, an applying hot pressure in which the supplied electrical conductor 30 is cured, and a protective member forming in which the protective member 40 is formed to cover the cured electrical conductor 30.

In the supplying, the electrical conductor 30 is supplied into the via holes 18a1 and 18a2 through an opening M1 of a mask MK while putting a squeegee into reciprocating motion in the printing process such as screen printing. The opening hole M1 of the mask MK is formed so as to expose the wiring pad 18 or to overlap with at least portions of the via holes 18a1 and 18a2 to expose portions of the surface of the wiring pad 18. Hence, in the supplying, the electrical conductor 30 is printed to form the in-hole portions 32 formed in the via holes 18a1 and 18a2 and the intervening portion 31 disposed on the portions of the surface of the wiring pad 18.

In the applying hot pressure, for example, pressing is performed while heat is applied using the upper and lower heating plates HL1 and HL2 whose temperatures can be controlled. The pressing may be performed with a release film being disposed on each of the heating plates HL1 and HL2. In the applying hot pressure, the intervening portion 31 of the electrical conductor 30 is cured in a more compressed state than at the time of printing, and the in-hole portions 32 of the electrical conductor 30 supplied into the via holes 18a1 and 18a2 are cured.

In the protective member forming, the protective member 40 is supplied from the one of the surfaces of the wiring board 15 to cover the wiring pad 18 and is pressed. In the protective member forming, the protective member 40 is formed to be higher than the covering layer 19 and to cover the electrical conductor 30.

As described above, the method of manufacturing the surface-emitting light source 100 includes Providing S11, Pressing S12, and Detaching S13. Hence, the space 12 is left between adjacent light-emitting modules 10, and the penetrating portion 21 of the adhesive 20 inside the space 12 includes the gap 22. Accordingly, the surface-emitting light source 100 with improved drop impact resistance can be manufactured.

Various modifications can be made to the surface-emitting light source and the method of manufacturing a surface-emitting light source described in the present disclosure within the scope of the claims as a matter of course.

What is claimed is:

1. A surface-emitting light source comprising:
    a plurality of light-emitting modules each comprising an array of a plurality of light sources; and
    a wiring board disposed on an array of the plurality of light-emitting modules with an adhesive interposed therebetween,
    wherein the plurality of light-emitting modules to be disposed on the wiring board are arranged such that a space is left between adjacent ones of the light-emitting modules,
    wherein the adhesive contains a thermosetting resin and comprises a penetrating portion inside the space, and
    wherein the penetrating portion comprises a gap detached from a lateral surface of the light-emitting modules.

2. The surface-emitting light source according to claim 1, wherein the wiring board comprises, at one of surfaces, a first wiring layer, and a pair of wiring pads continuous with the first wiring layer corresponding to one of the light-emitting modules;

wherein the pair of wiring pads each includes at least two via holes;

wherein the wiring board comprises an electrical conductor supplied to extend over the at least two via holes; and wherein a protective member covers the electrical conductor from the one of the surfaces.

3. The surface-emitting light source according to claim 2, wherein the via holes comprises sets of two neighboring via holes, and wherein the sets of two neighboring via holes are arranged side by side in such a way that respective two neighboring via holes are aligned obliquely relative to a direction of alignment of the light sources.

4. The surface-emitting light source according to claim 1, wherein the penetrating portion is located closer to the wiring board than an intermediate position in a height direction of the space in a cross-sectional view.

5. The surface-emitting light source according to claim 1, wherein the gap is formed in the penetrating portion facing at least one of lateral surfaces of the adjacent light-emitting modules.

6. The surface-emitting light source according to claim 1, wherein at least one of lateral surfaces of the adjacent light-emitting modules has a chamfered portion allowing a width of the space to increase toward the wiring board.

7. The surface-emitting light source according to claim 1, wherein the adhesive has a melt viscosity at 60° C. of $5.0 \times 10^4$ to $7.0 \times 10^5$ P or a melt viscosity at 120° C. of $4.0 \times 10^4$ to $2.0 \times 10^5$ P.

8. The surface-emitting light source according to claim 1, wherein the light source comprises:

a light-emitting element;

a light-transmissive member attached to a light extraction surface of the light-emitting element;

a covering member disposed on a lateral surface of the light-emitting element;

a light-reflective member disposed on a lateral surface of the covering member; and a light-guiding plate disposed in contact with the light-reflective member and configured to perform surface light emission.

9. The surface-emitting light source according to claim 8, wherein the light-guiding plate has a first main surface that serves as a light emission surface and a second main surface opposite to the first main surface, and the second main surface has a recess accommodating the light-transmissive member.

10. The surface-emitting light source according to claim 9, wherein the light-guiding plate includes an optical functional portion on the first main surface, wherein the optical functional portion is configured to reflect a light emitted from the light-emitting element to be radially spread out.

11. The surface-emitting light source according to claim 8, wherein the covering member contains a light-reflective material having a reflectance of 60% or more of light emitted from the light-emitting element.

12. The surface-emitting light source according to claim 8, wherein the light-guiding plate has a through hole passing through the first main surface and the second main surface to accommodate the light-transmissive member or the light-emitting element.

13. The surface-emitting light source according to claim 8, wherein the light-emitting element and the light-transmissive member in the light source are bonded to each other by using a light-transmissive adhesive, wherein the light-transmissive adhesive is formed as a fillet on the lateral surface of the light-emitting element.

14. The surface-emitting light source according to claim 1, wherein the wiring board includes an insulating base member on which the first wiring layer is disposed.

15. The surface-emitting light source according to claim 1, wherein the space has a distance of 10 μm to 150 μm between the adjacent light-emitting modules.

16. A method of manufacturing a surface-emitting light source comprising:

providing:

a plurality of light-emitting modules each comprising an array of a plurality of light sources; and a wiring board disposed on an array of the plurality of light-emitting modules arranged such that a space is left between adjacent ones of the light-emitting modules with an adhesive containing a thermosetting resin interposed therebetween;

applying heat and pressure to the adhesive to bond the wiring board to the plurality of light-emitting modules by melting and curing the adhesive and to form a penetrating portion by curing the adhesive having molten and entered the space; and detaching the penetrating portion from a lateral surface of the light-emitting modules by applying pressure to the space to form a gap.

17. The method of manufacturing a surface-emitting light source according to claim 16, wherein the detaching comprises applying pressure to the space by pressing a jig against the space from the wiring board bonded to the plurality of light-emitting modules.

18. The method of manufacturing a surface-emitting light source according to claim 16, wherein the detaching comprises applying pressure to the space by placing the plurality of light-emitting modules bonded to the wiring board on a stage and pressing a roller against the space.

19. The method of manufacturing a surface-emitting light source according to claim 16, wherein the detaching comprises pressing to allow the plurality of light-emitting modules bonded to the wiring board to be flat.

20. The method of manufacturing a surface-emitting light source according to claim 16, wherein the adhesive has a melt viscosity of $5.0 \times 10^4$ to $7.0 \times 10^5$ P at 60° C. or a melt viscosity of $4.0 \times 10^4$ to $2.0 \times 10^5$ P at 120° C.

* * * * *